United States Patent
Malkani et al.

(10) Patent No.: US 12,346,643 B1
(45) Date of Patent: Jul. 1, 2025

(54) TESTING INTEGRATED CIRCUIT DESIGNS WITH ACCELERATED REPLAY

(71) Applicant: Amazon Technologies, Inc., Seattle, WA (US)

(72) Inventors: Siddharth Malkani, Leander, TX (US); Horace Lau, Mountain View, CA (US); Sundeep Amirineni, Austin, TX (US); Dana Michelle Vantrease, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 1129 days.

(21) Appl. No.: 17/301,251

(22) Filed: Mar. 30, 2021

(51) Int. Cl.
*G06F 30/331* (2020.01)

(52) U.S. Cl.
CPC .................. *G06F 30/331* (2020.01)

(58) Field of Classification Search
CPC .................................................. G06F 30/331
See application file for complete search history.

(56) References Cited

U.S. PATENT DOCUMENTS

2019/0034179 A1* 1/2019 Moiseev ............. G06F 30/3308

OTHER PUBLICATIONS

Yang (Yang, L., Wang, L., Zhang, X., & Wang, D. (2016). An approach to build cycle accurate full system VLIW simulation platform. Simulation Modelling Practice and Theory, 67, 14-28.) (Year: 2016).*

* cited by examiner

*Primary Examiner* — Bijan Mapar
(74) *Attorney, Agent, or Firm* — Weaver Austin Villeneuve & Sampson LLP

(57) ABSTRACT

A technique to stress test an integrated circuit design under test in a simulation environment may include running a simulation that includes providing bus interface transactions and idle cycles on a bus interface of an integrated circuit design. The technique may further include capturing bus interface activity on the bus interface during the simulation to generate a stimulus file and replaying the simulation by executing a test bench driver that reads the stimulus file and injects the bus interface transactions with modified idle cycles onto the bus interface of the integrated circuit design.

20 Claims, 9 Drawing Sheets

TESTING INTEGRATED CIRCUIT DESIGNS WITH ACCELERATED REPLAY

BACKGROUND

Functional simulations can be used to test the functionality of an integrated circuit design before tape out. For complex designs, the simulations may include simulating multiple components that interact with each other. For example, a computing system such as a system-on-a-chip may include a processor component, a memory subsystem, and one or more peripheral devices such as hardware accelerators. The simulations used to verify the functionality of the such systems may involve a test environment that simulates these components together to ensure interoperability between the components.

BRIEF DESCRIPTION OF THE DRAWINGS

Various embodiments in accordance with the present disclosure will be described with reference to the drawings, in which.

DETAILED DESCRIPTION

Figure 1:
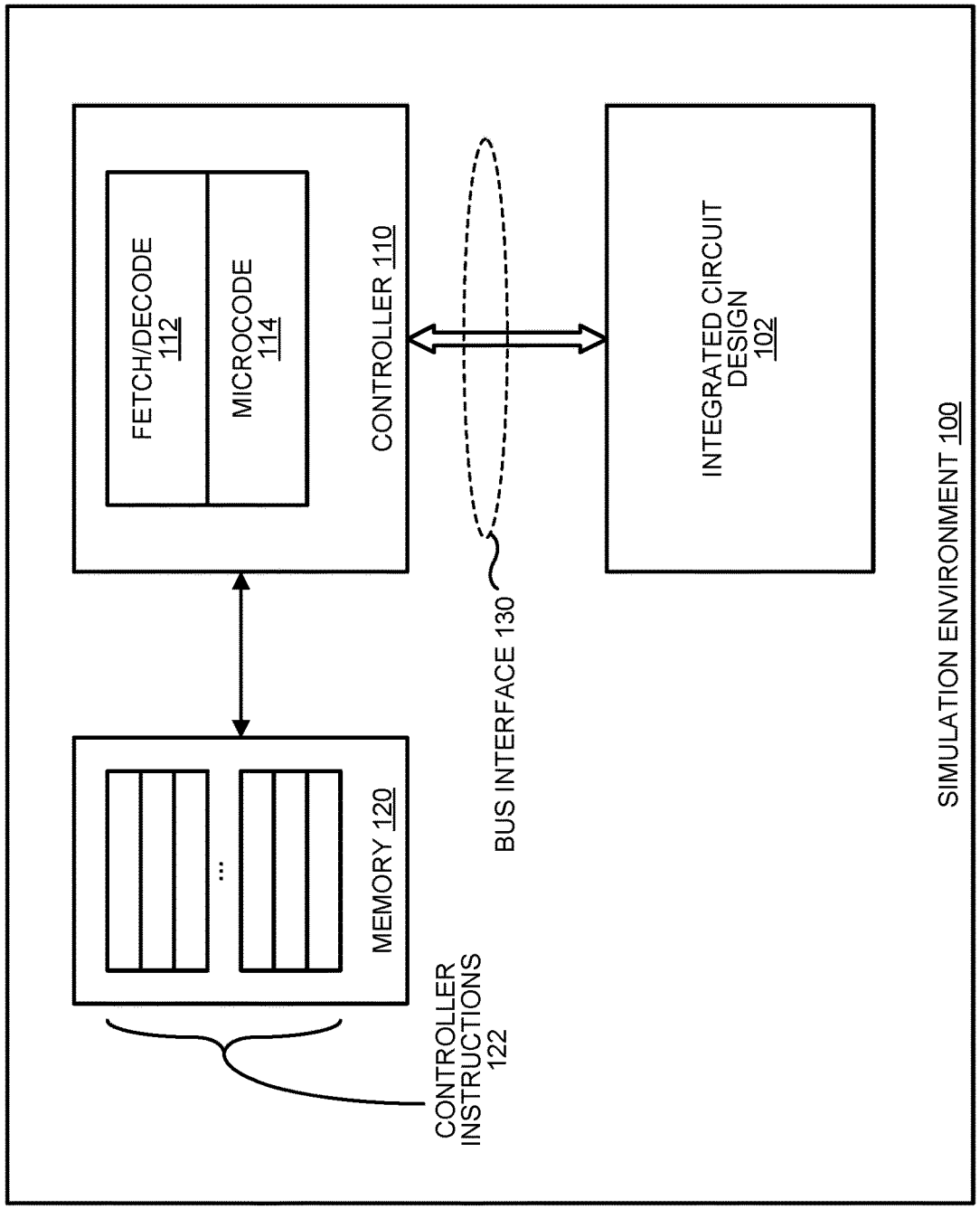
FIG. 1 illustrates an example of a simulation environment to test an integrated circuit design.

Microcode is code or software that executes in a controller (e.g., a processor) to implement the functionality of the controller's instruction set. The microcode can interpret or translate a controller instruction from the instruction set into low level hardware functions to perform the task directed by the controller instruction. For example, an add instruction to perform an addition operation on two operands can be translated by the microcode into a set of functions to load the two operands into registers of an arithmetic logic unit, configure the arithmetic logic unit to perform an addition operation on the contents of the registers, and copy the output of the arithmetic logic unit to a target location. Microcode can also be used by a controller to translate a controller instruction into device instructions to control and communicate with other components such as accelerators and/or peripheral devices.

During the design of an integrated circuit device that interacts with a controller, functional simulations can be run to verify the interoperability between the controller and the integrated circuit design. In the simulation environment, a controller model (e.g., a processor core model) can read controller instructions from a memory model, execute microcode to interpret the controller instructions, and dispatch device instructions based on the controller instructions to the integrated circuit design under test. However, the microcode of the controller may not be optimized for the integrated circuit design under test. As such, it's possible for the integrated circuit design to tape out with undiscovered logic bugs, because the integrated circuit design has not been stress tested during simulation. By way of example, an unoptimized version of the microcode may incur latency when translating the controller instructions into device instructions, and as a result, the controller model may not be able to send a continuous stream of device instructions to the integrated circuit design. Without a continuous stream of device instructions, the integrated circuit design may operate at a reduced throughput during the simulation. This can mask logic bugs that present themselves when the integrated circuit design is operating at or close to full capacity.

To stress test the integrated circuit design, an initial simulation that uses the controller's microcode to send stimulus to the integrated circuit design is performed, and the stimulus is recorded into a stimulus file. Thereafter, a test bench driver is used to read the stimulus file and inject the stimulus directly into the integrated circuit design. During this subsequent phase of testing the integrated circuit design, the controller's microcode is bypassed and the stimulus is injected without relying on the microcode. Because the stimulus is no longer dependent on the microcode, idle cycles in the stimulus can be removed to reduce idle time and increase throughput of the integrated circuit design under test. This allows the integrated circuit design to be stress tested without requiring an optimized microcode. Subsequent iteration of the simulation can also be executed in less time because the same amount of device instructions can be injected into integrated circuit design using fewer number of clock cycles than the initial simulation because of the removal of idle cycles.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example of a simulation environment 100 that can be used to test an integrated circuit design. Simulation environment 100 may include a controller model 110, a memory model 120, and an integrated circuit design 102. Integrated circuit design 102 is a design (e.g., register-transfer level (RTL) model) of an integrated circuit device that interacts with a controller represented by controller model 110. The integrated circuit device (which may be referred to as a device under test (DUT)) can be a peripheral device or other types of component that communicates with a controller. Examples of the integrated circuit device may include a hardware accelerator such as a graphics processing unit, a digital signal processing unit, a neural network accelerator, or other computational unit that can perform computations for a controller; a network interface component such as a network interface controller, network interface adaptor, or other types of network components that provide network connectivity; a data movement engine such as a direct memory access device or other types of data management device; a memory device or data storage device; an input/output (I/O) device such as a user interface device; etc.

Memory model 120 is a RTL model or an intellectual property (IP) block representing an instruction memory. The instruction memory can be a random access memory (RAM) or a read-only memory (ROM) that stores a set of controller instructions 122. The controller instructions 122 may include controller instructions that are defined in an instruction set of a controller architecture (e.g., a processor instruction set). The set of controller instructions 122 can implement a program to control the behavior of controller model 110, and to direct controller model 110 to perform certain computational tasks.

Controller model 110 is a RTL model or an IP core block representing a controller. In some implementations, the controller can be a general-purpose processor or a customizable processor that is modified based on the particular application of the system incorporating the processor. For example, a customizable processor may include optional modular blocks (e.g., cache, memory management unit (MMU), encryption unit, floating-point unit, etc.) that can be selectively included in the design. Controller model 110 includes a fetch/decode unit 112 and microcode 114 stored in a RAM or ROM model. Fetch/decode unit 112 is used to fetch controller instructions 122 from memory model 120, and decode the controller instructions 122 to load an execution pipeline of controller model 110. During execution of the controller instructions 122, controller model 110 may invoke microcode 114 to interpret and translate the controller instructions into low-level functions to perform the task directed by the controller instructions.

In some implementations, the low-level functions may include interactions with another component or device such as integrated circuit design 102. Referring to FIG. 1, controller model 110 may interact with integrated circuit design 102 via a bus interface 130 that couples controller model 110 to integrated circuit design 102. For example, controller model 110 may provide bus interface transactions on bus interface 130 to communicate and/or exchange information with integrated circuit design 102. The communications between controller model 110 and integrated circuit design 102 may include device instructions to configure and/or control integrated circuit design 102. Bus interface 130 may include a data bus to carry information, and a set of one or more control signals to control the flow of transmission on the data bus. In some implementations, bus interface 130 may also include an address bus to transmit device identifiers if bus interface 130 is used to communicate with multiple components or devices. Bus interface 130 may conform to a processor architecture bus protocol (e.g., advanced extensible interface (AXI), open core protocol (OCP), etc.), or to a proprietary communication protocol.

Figure 2:
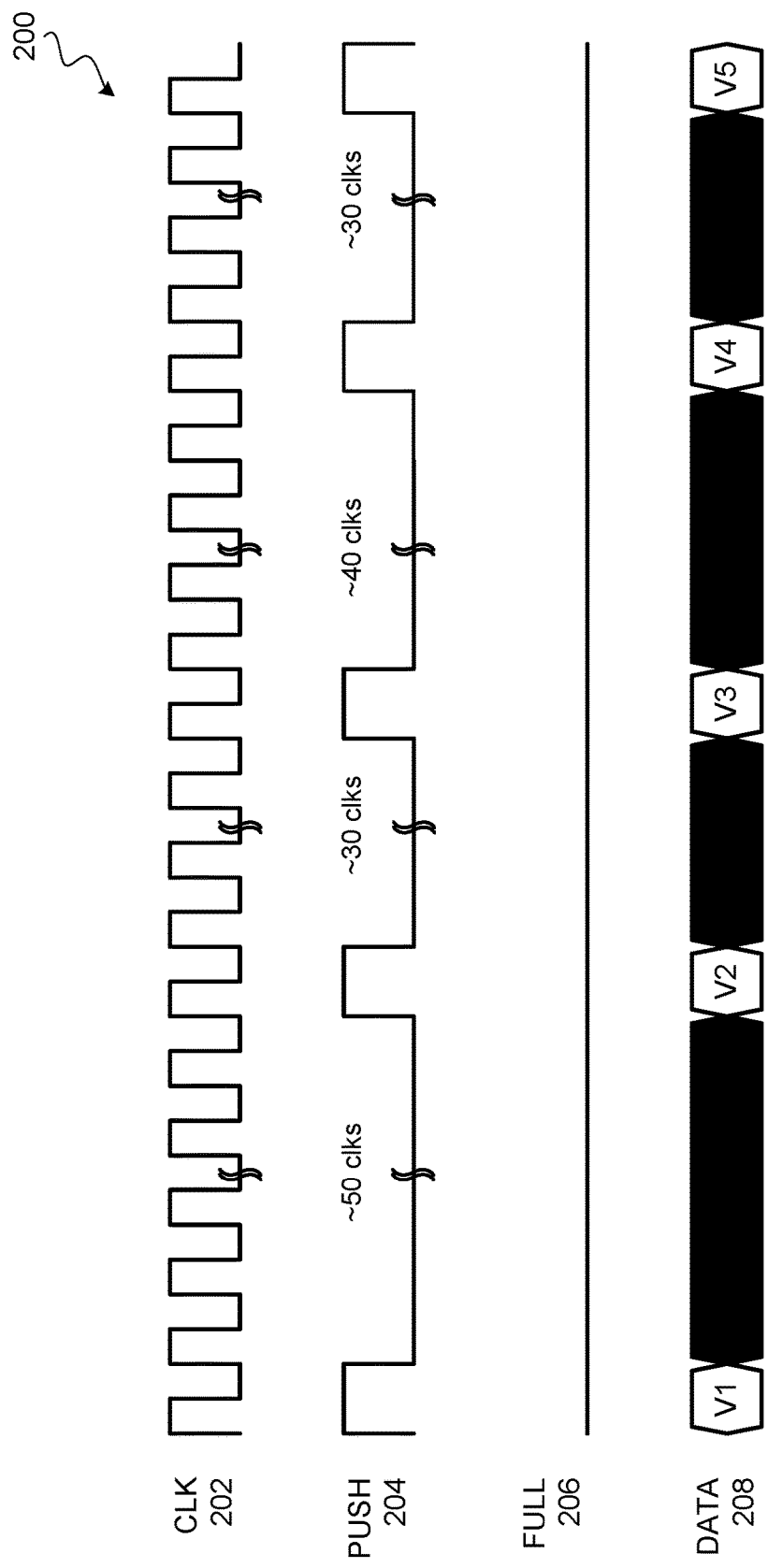
FIG. 2 illustrates an example of a timing diagram of a controller model interacting with an integrated circuit design.

FIG. 2 illustrates an example of a timing diagram 200 of a controller model interacting with an integrated circuit design under test. Timing diagram 200 can be, for example, generated by simulation environment 100 simulating a controller model 110 interacting with integrated circuit design 102, and the bus signals shown in waveform 200 may correspond to signals of bus interface 130. The bus signals in timing diagram 200 may include a clock signal (CLK) 202, a push signal (PUSH) 204, a full signal (FULL) 206, and a data bus (DATA) 208. The clock signal 202 is used to synchronize the bus interface transactions presented on the data bus 208. In some implementations, the clock signal 202 can be at the same frequency as the operating frequency of the controller.

The push signal 204 is an output of the controller model, and is used to indicate that a valid bus interface transaction (e.g., valid data) is being presented on data bus 208 for the integrated circuit design. When the push signal 204 is asserted, the integrated circuit design interacting with the controller model may, for example, latch the data presented on data bus 208 and place the data onto a processing queue of the integrated circuit design. For instance, if the bus interface transactions are device instructions to configure or control the integrated circuit design, the integrated circuit design can latch the value presented on data bus 208 when the push signal 204 is asserted, and provide that value as a device instruction to the instruction queue of the integrated circuit design.

The full signal 206 is an output of the integrated circuit design, and is used by the integrated circuit design to indicate to the controller model that a processing queue of the integrated circuit design is full and unable to process further data on data bus 208. When the full signal 206 is asserted, the controller model may hold the current data on data bus 208, and halt any further transition on data bus 206 such that no additional bus interface transactions are provided to the integrated circuit design until the full signal 206 is deasserted. Frequent assertion of the full signal 206 may indicate that the integrated circuit design is operating at or close to full capacity and peak performance, whereas infrequent assertion of the full signal 206 may indicate that the integrated circuit design is not fully loaded and may be operating at a reduced capacity.

Data bus 208 may include any number of data bits (e.g., hundreds or even thousands of data bits) to exchange information between the controller model and the integrated circuit design under test. In implementations in which the bus interface transactions presented on data bus 208 include device instructions for the integrated circuit design under test, data bus 208 may include an instruction field and one or more operand fields that may vary depending on the value of the instruction field. In some implementations, the field definition of data bus 208 may change depending on the particular device instruction being issued. In such instances, the device instruction can be used, for example, by the integrated circuit device to determine the definition fields of the particular bus interface transaction and the type of information being transferred on data bus 208. Data bus 208 may include a sufficient number of data bits to transmit, in one clock cycle, the device instruction, operands used by the device instruction, and additional information that the integrated circuit design may need to execute the device instruction.

By way of example, if the bus interface transaction is issuing a data movement instruction to the integrated circuit design, the bus interface transaction provided on data bus 208 may include a move instruction, a source address, a target address, the data being moved, a length of the data, and/or a datatype of the data. As another example, if the bus interface transaction is issuing an instruction to perform a floating-point mathematical operation, the bus interface transaction provided on data bus 208 may include a mathematical operator instruction (e.g., add, subtract, multiply, divide, etc.), one or more floating point numbers, and a length and/or datatype of the numbers being operated on.

In the example timing diagram 200 of FIG. 2, the controller model is reading controller instructions from an instruction memory and executing microcode to translate the controller instructions into bus interface transactions (e.g., device instructions) for the integrated circuit design under test. As shown in timing diagram 200, the controller model does not send a continuous stream of bus interface transactions on data bus 208. Instead, each bus interface transaction provided on data bus 208 is separated by idle cycles (shown as shaded cycles on data bus 208). The separation of the bus interface transactions is also indicated by the pulses of the push signal 204. By way of example, the controller model may provide bus interface transaction V2 to the integrated circuit design after ~50 idle cycles from bus interface transaction V1; bus interface transaction V3 after ~30 idle cycles from bus interface transaction V2; bus interface transaction V4 after ~40 idle cycles from bus interface transaction V3; bus interface transaction V5 after ~30 idle cycles from bus interface transaction V4; etc.

The controller model may dispatch the bus interface transactions on data bus 208 with intervening idle cycles because of unoptimized microcode causing excessive decoding or translation latency. The microcode may not be fully optimized for interacting with the integrated circuit design, because the integrated circuit design is still being tested, and the microcode can be a pre-release version that is still under development. In some implementations, the microcode can be optimized for the integrated circuit design after the integrated circuit design has been tested and finalized. The intervening idle cycles can also be caused by the latency of the controller model reading the controller instructions from the instruction memory. The presence of the idle cycles on data bus 208 means that the integrated circuit design is not operating at peak performance. This is also indicated by the extended deasserted state of the full signal 206. Testing the integrated circuit design under such a simulation environment may not catch logic bugs that occur when the integrated circuit design is operating at peak performance and under stressed conditions.

Figure 3:
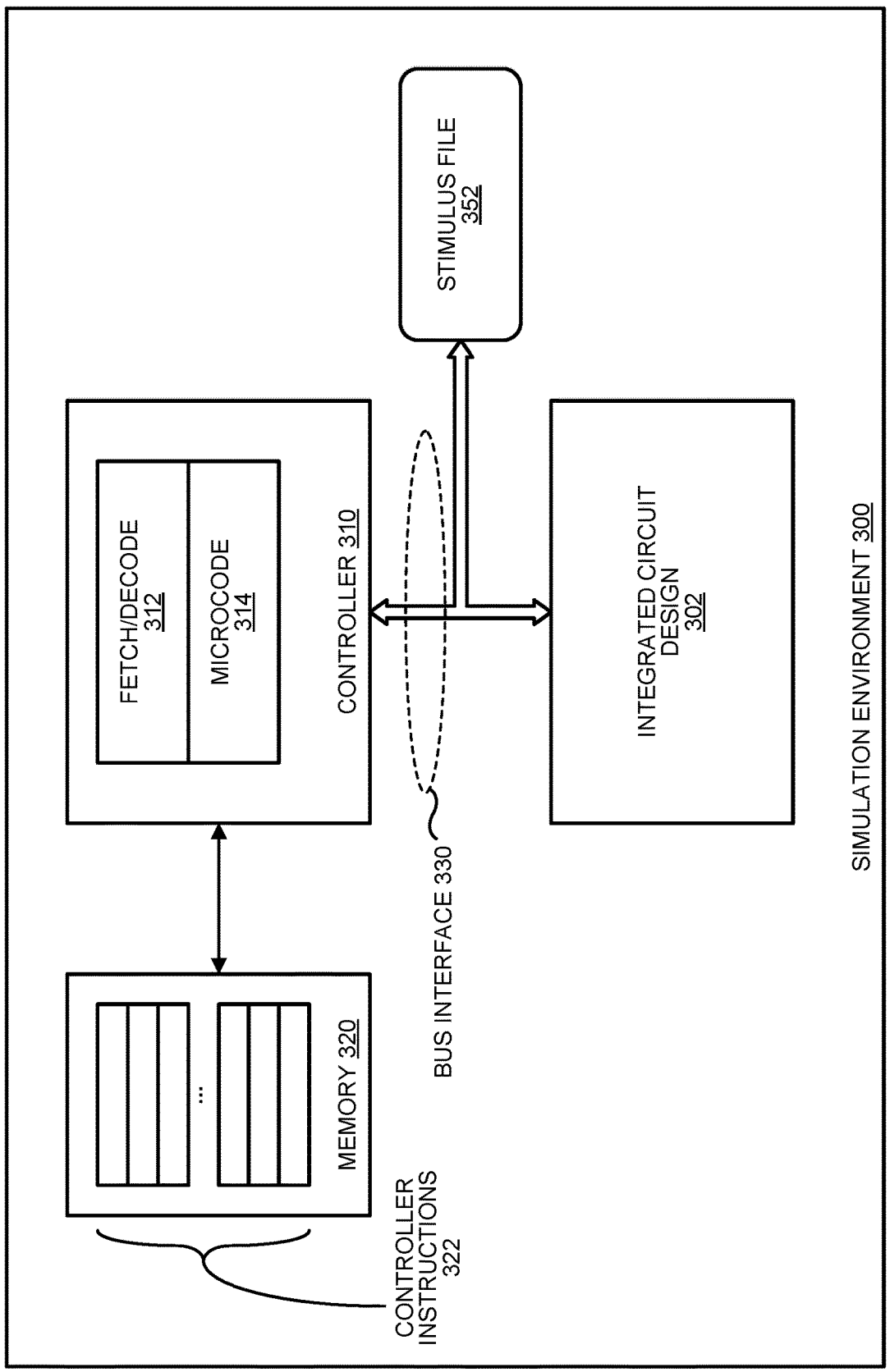
FIG. 3 illustrates an example of a simulation environment of a first phase of testing an integrated circuit design.

FIG. 3 illustrates an example of a simulation environment 300 during a first phase of testing an integrated circuit design. This first phase can be used to set up stress testing of the integrated circuit design. Simulation environment 300 includes a controller model 310 having a fetch/decode unit 312 that fetches controller instructions 322 from memory model 320. Controller model 310 may execute microcode 314 to translate controller instruction 322 into bus interface transactions (e.g., device instructions) for integrated circuit design 302. These components are similar to simulation environment 100, and thus a detailed description of which need not be repeated. Simulation environment 300 may initially be used to simulate integrated circuit design 302 in a similar manner as simulation environment 100, and thus the bus interface transactions similar to those shown in timing diagram 200 may be generated and presented on the bus interface 330 between controller model 310 and integrated circuit design 302.

Simulation environment 300 is further configured to capture the bus interface activity on bus interface 330 into a stimulus file 352. In some implementations, the simulator may have the capability to export the state of signals in the simulation environment over time into a file. In such instances, one or more signals of bus interface 330 can be selected in the simulator for capture, and the simulator can export the state of the selected signals (e.g., data bus of bus interface 330) to generate stimulus file 352. In some implementations, a testbench monitor can be implemented (e.g., in system Verilog) to capture the state of one or more signals of bus interface 330 during the simulation into stimulus file 352. This can be done, for instance, by instantiating test signals in the testbench monitor, and driving those signals with the signals from bus interface 330. The values presented on the test signals during simulation can be written into stimulus file 352 using system Verilog commands.

The stimulus file 352 can be, for example, a binary file or a text file, and may include data bus information correlated with time information. For example, each line of stimulus file 352 may represent a clock cycle, and the state of the data bus at each clock cycle can be recorded on a line in the stimulus file. As another example, to reduce file size, instead of storing the state of the data bus at each and every clock cycle of the simulation, stimulus file 352 may store transition information on the data bus along with a time stamp of the transition. Thus, a new value may be stored in stimulus file 352 only when the data bus changes state. For instance, when the data bus is in the same state for 5 clock cycles, instead of storing 5 values representing the same state of the data bus at each clock cycle, only one value along with a timestamp of when the data bus transitioned to that state is stored in stimulus file 352. The time stamp can be represented in simulation time (e.g., nanosecond), or in terms of clock cycle number. Hence, the bus interface transactions on bus interface 330 and the timing thereof can be captured by simulation environment 300 into stimulus file 352 for subsequent replay.

Figure 4:
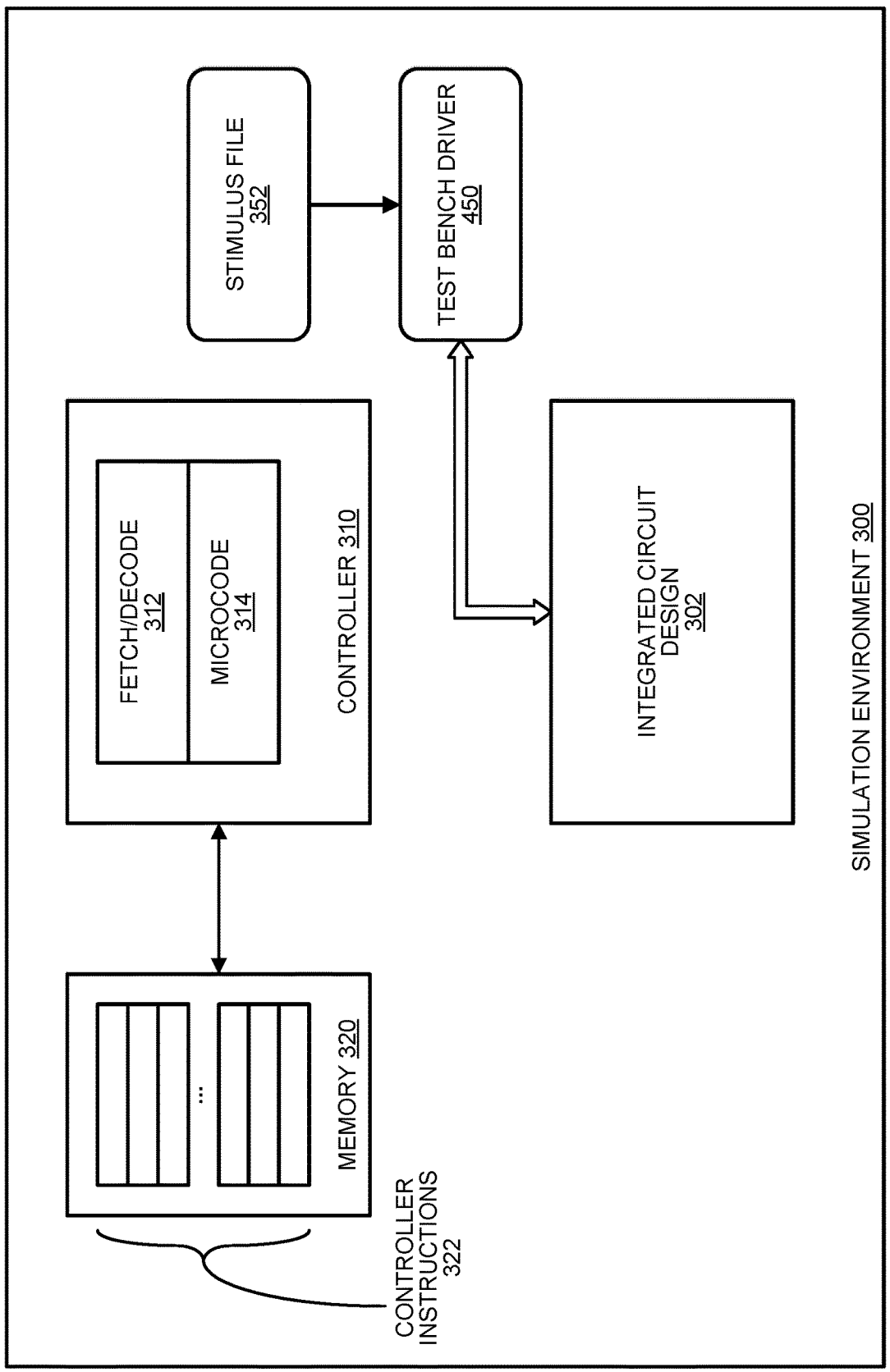
FIG. 4 illustrates an example of a simulation environment of a second phase of testing an integrated circuit design.

FIG. 4 illustrates an example of a simulation environment 300 during a second phase of testing an integrated circuit design. This second phase can be used to perform stress testing of the integrated circuit design. Having captured the bus interface transactions dispatched from controller model 310 to the integrated circuit design 302 during a normal simulation run, the previously captured bus interface transactions can be injected into integrated circuit design 302 with one or more idle cycles removed. In some implementations, the bus interface transactions can be injected into integrated circuit design 302 with all of the idle cycles removed. This can force the integrated circuit design 302 to operate at or close to full capacity and peak performance to check for logic bugs under such operating conditions.

Referring to FIG. 4, a test bench driver 450 can be implemented to read stimulus file 352 and inject the bus interface transactions captured in stimulus file 352 directly into integrated circuit design 302. During this second phase of testing, controller model 310 can be held in reset to prevent controller model from driving the bus interface. This can be achieved by forcing the reset signal to controller model 310 to an asserted state.

Test bench driver 450 can be implemented, for example, using system Verilog, and stimulus file 352 can be read in simulation environment 300 using system Verilog commands. Test bench driver 450 can be configured to read a captured state of the data bus of bus interface 330 in stimulus file 352, and drive a corresponding value onto the data bus of integrated circuit design 302. When the captured state read by test bench driver 450 is an idle cycle (e.g., all zeros on the data bus), test bench driver 450 may decide to skip the current state and drive the next state onto the data bus of integrated circuit design 302. In this manner, the captured bus interface transactions form stimulus file 352 can be injected into the integrated circuit design with one or more of the idle cycles removed. In some implementations, test bench driver 450 can be configured, for example, to randomly remove idle cycles, remove idle cycles according to a pattern (e.g., remove every other idle cycle, remove a specified number of idle cycles when there are more than a certain number of consecutive idle cycles, remove idle cycles between specific bus interface transactions or device instructions, etc.), or remove all idle cycles. Test bench driver 450 can also be configured to insert idle cycles to test the response of the integrated circuit design. More generally, the idle cycles of a simulation can be modified during replay of the simulation by removing idle cycles, inserting idle cycles, or a combination of both.

Test bench driver 450 can also be configured to perform flow control on the bus interface. Test bench driver 450 can be configured to monitor a full signal from integrated circuit design 302, which indicates whether a processing queue of integrated circuit design 302 is full. In response to the full signal being asserted, test bench driver may maintain the current state of the data bus until the full signa is deasserted. Thereafter, in response to the full signal being deasserted, the test bench driver can inject the next state from the stimulus file 352 onto the data bus. Test bench driver 450 can also be configured to assert a push signal when a non-idle cycle is being driven onto the data bus of the bus interface.

Figure 5:
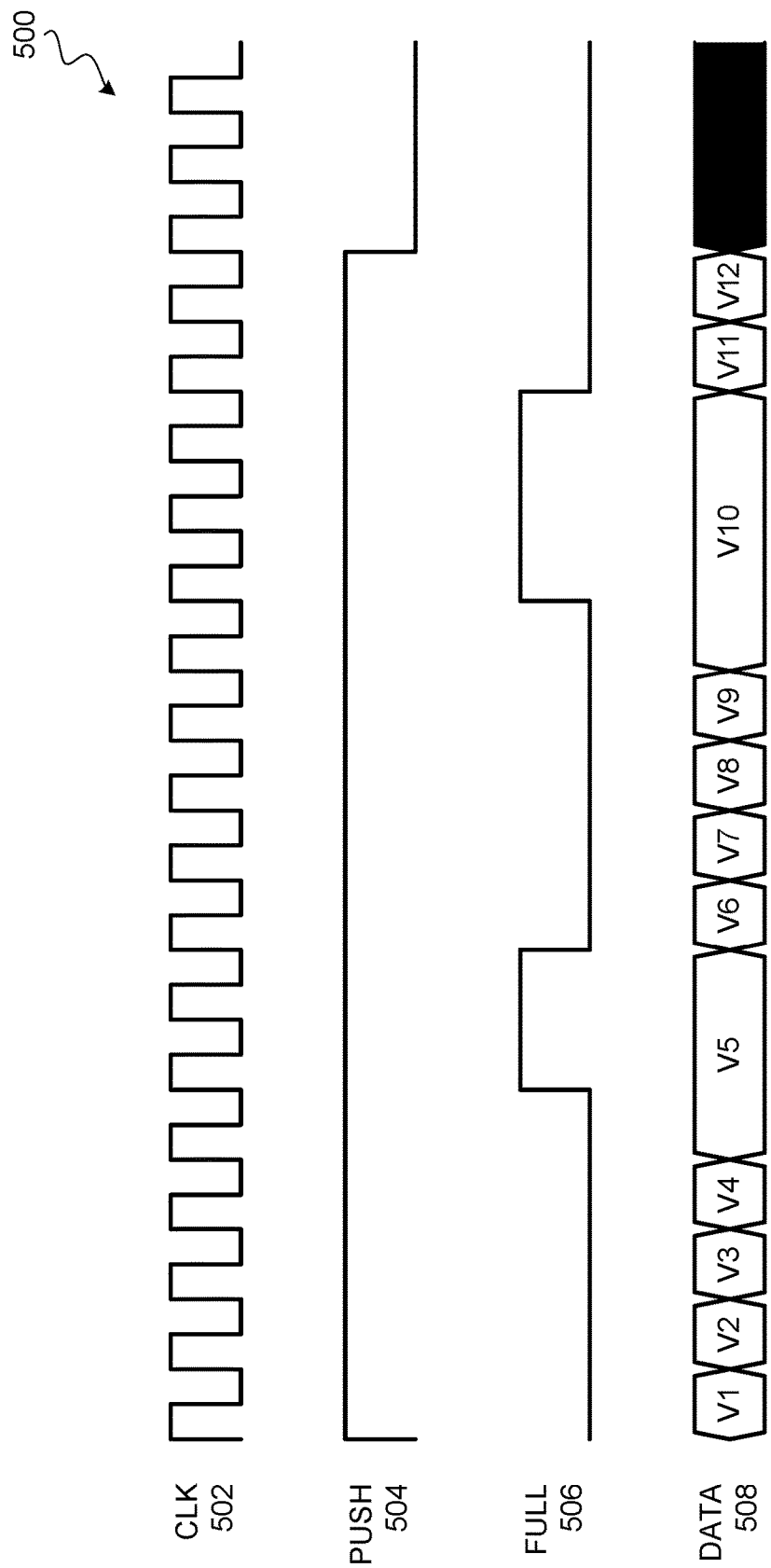
FIG. 5 illustrates an example of a timing diagram of a test bench driver interacting with an integrated circuit design.

FIG. 5 illustrates an example of a timing diagram 500 of a test bench driver interacting with an integrated circuit device. Timing diagram 500 can be, for example, generated from simulation environment 300 during the second phase of testing integrated circuit design 302. This second phase of testing can be used to stress test integrated circuit design 302 by forcing integrated circuit design 302 to operate at or close to full capacity and peak performance. The bus signals shown in waveform 500 may correspond to signals of bus interface 330. The bus signals in timing diagram 500 may include a clock signal (CLK) 502, a push signal (PUSH) 504, a full signal (FULL) 506, and a data bus 508, similar to those described above.

As shown in timing diagram 500, bus interface transaction V1 to V5 are being injected into integrated circuit design 302 without any of the intervening idle cycles from timing diagram 200. The continuous stream of bus interface transactions (e.g., device instructions) forces the integrated circuit design to operate at full capacity, and the full signal 506 is asserted after the integrated circuit design received bus interface transaction V5. Once the integrate circuit design catches up with the data processing and deasserts the full signal 506, the next set of continuous bus interface transactions V6 to V10 are sent to the integrated circuit design in another continuous stream with a new bus interface transaction (e.g., device instruction) at each clock cycle. This continues until the processing queue of the integrate circuit design becomes full again. As can be seen, the full signal 506 is asserted often to indicate that the processing queue of integrated circuit design 302 is operating at or close to full capacity.

The simulation shown in FIG. 5 bypasses the microcode of the controller model, and allows manipulation of the timing and how frequent bus interface transactions are provided on the bus interface. Such a simulation can be used, for example, to test the functionality of the full signal 506, which may otherwise not be properly tested with a simulation that relies on the microcode of the controller model. The capability to manipulate the bus interface transactions can also be used to test corner cases, error conditions, and interrupt handling. For example, instead of maintain the bus interface transaction V5 on the data bus when the full signal 506 is first asserted, the test bench driver may force a new bus interface transaction onto the data bus to cause an error exception. Such a simulation can test how the integrated circuit design and/or the controller model handle such erroneous conditions in the system. It should also be understood that not all of the idle cycles need to be removed, and that some simulations may choose to provide one or more intervening cycles in the stream of bus interface transactions.

In addition to the capability of forcing the integrate circuit into certain conditions, once a stimulus has been captured in a stimulus file, subsequent iterations of the simulation can also be repeated in much less time. For example, to test the integrate circuit design's response to bus interface transactions V1 to V5, the simulation of FG. 2 may require the simulation to run for 155 clock cycles. In contrast, using the accelerated replay mechanism, the integrate circuit design's response to bus interface transactions V1 to V5 can be tested in 5 clock cycles of simulation run time as shown in FIG. 5.

Figure 6:
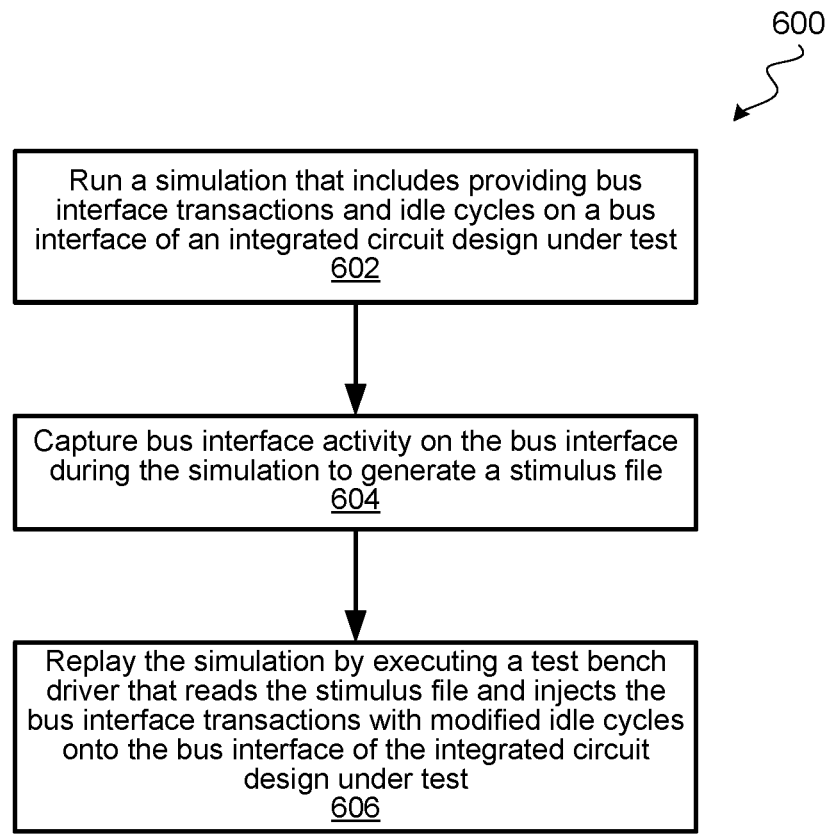
FIG. 6 illustrates a flow diagram of an example of a process for testing an integrated circuit design.

FIG. 6 illustrates a flow diagram of an example of a process 600 for testing an integrated circuit design. Process 600 can be performed using one or more processors of a computing system that implements a simulation environment to test an integrated circuit design interacting with a controller model. In some implementations, the integrated circuit design can be, for example, a design of a hardware accelerator or other peripheral components that can offload computations or functions from the controller, and/or communicate with the controller.

At block 602, process 600 may begin by running a simulation that includes providing bus interface transactions and idle cycles on a bus interface of an integrated circuit design under test. The bus interface transactions can be generated by a controller model executing microcode. For instance, the controller model may read controller instructions, and the microcode can be used to interpret or translate the controller instructions into bus interface transactions such as device instructions for the integrated circuit design under test.

By way of example, the controller model may read a controller instruction to perform a computation, and the microcode may translate the controller instruction into bus interface transactions that include data movement instructions being dispatched to the integrated circuit design under test. The data movement instructions may cause the integrated circuit design to fetch data from memory locations and load the data into a computational logic block of the integrated circuit design to perform the computation. The idle cycles provided on the bus interface can be a by-product of the microcode being a pre-release version that is still under development and undergoing optimization.

At block 604, bus interface activity on the bus interface during the simulation of block 602 is captured to generate a stimulus file. The stimulus file may include data bus state information correlated with time information. For example, the stimulus file may capture the state of the data bus at each clock cycle of the simulation, or may capture the state of the data bus at each state transition along with a timestamp (e.g., simulation time, or clock cycle number) of the state transition. The stimulus file can be generated by an export function of the simulator or a testbench monitor (e.g., system Verilog monitor), and the stimulus file can be represented, for example, as a binary file or as a text file. The stimulus file may keep the idle cycles appearing on the data bus, or the idle cycles can be modified (inserted and/or removed) as the bus interface activity is captured to generate the stimulus file.

At block 606, the simulation is replayed by executing a test bench driver (e.g., a system Verilog driver) that reads the stimulus file generated at block 604 and injects the bus interface transactions onto the bus interface of the integrated circuit design under test with idle cycles in the simulation of block 602 removed. In some implementations, replaying the simulation may include modifying (remove and/or insert) the idle cycles captured in the stimulus file as the data bus states are read from the stimulus file. In some implementations, some or all of the idle cycles can be removed. The idle cycles can be removed, for example, at random or according to a certain pattern (e.g., remove every other idle cycle, remove a specified number of idle cycles when there are more than a certain number of consecutive idle cycles, remove idle cycles between specific bus interface transactions or device instructions, etc.). If the stimulus file already includes the modified idle cycles, the stimulus file can be replayed as is, or further modifications can be made to the idle cycles during replay. While the simulation is being replayed, the controller model can be held in reset to prevent the controller model from driving the bus interface. The simulation can also be replayed without include the controller model.

In some implementations, the test bench driver can provide flow control on the bus interface similar to how the controller model interacts with the integrated circuit design under test. For example, the bus interface may include a full signal indicating whether a processing queue of the integrated circuit design is full. In response to the full signal being asserted, the test bench driver can maintain the current bus interface transaction of the bus interface until the full signal is deasserted. Thereafter, in response to the full signal being deasserted, the test bench driver may proceed to inject the next bus interface transaction onto the bus interface. The bus interface may also include a push signal to indicate that a valid bus interface transaction (e.g., non-idle state) is present on the bus interface, and the test bench driver may assert the push signal when injecting valid bus interface transactions.

By providing the capability to modify or remove idle cycles, process 600 can be used to stress test the integrated circuit design by forcing the integrated circuit design to operate at or close to full capacity and peak performance. Process 600 can also be used to force error conditions to test error handling of the system. Furthermore, process 600 may also allow subsequent iterations of the simulation to be performed in less time, because removing the idle cycles reduces the run time of the simulation.

Figure 7:
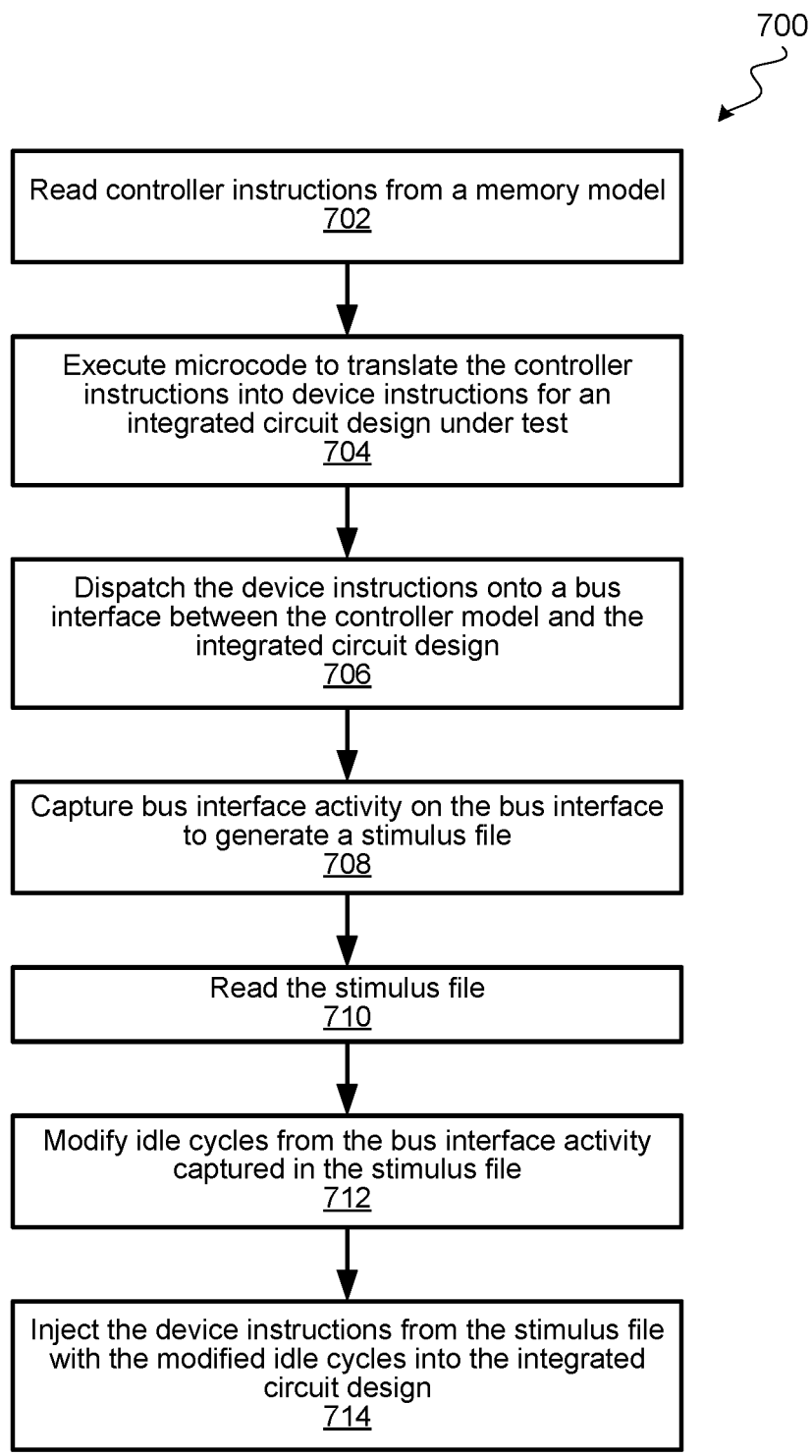
FIG. 7 illustrates a flow diagram of another example of a process for testing an integrated circuit design.

FIG. 7 illustrates a flow diagram of a more detailed example of a process 700 for testing an integrated circuit design. Process 700 may include a first phase that runs a simulation relying on microcode to set up stress testing for the integrated circuit design, and a second phase that stress tests integrated circuit design by replaying the simulation without relying on microcode.

This first phase of running the simulation may begin at block 702 with a controller model reading controller instructions from a memory model. The controller model can be a model of a general-purposed controller, or a customizable controller. The controller instructions can be part of the instruction set associated with the controller architecture of the controller model. The memory model can be a model of an instruction RAM and/or ROM.

At block 704, the controller model may execute microcode to translates the controller instructions into device instructions for the integrated circuit design under test. In some implementations, the microcode may still be under development and may not necessarily be optimized for the integrated circuit design under test. As such, the microcode may incur some latency when translating the controller instructions into device instructions.

At block 706, the controller model may dispatch the device instructions onto a bus interface between the controller model and the integrated circuit design. The bus interface may include a clock signal and a data bus to exchange information between the controller model and the integrated circuit design under test. The bus interface may also include flow control signals such as a push signal to indicate that a valid device instruction is present on the data bus, and a full signal generated by the integrated circuit design under test to indicate that a processing queue of the integrated circuit design is full. Due to the latency of the microcode, the controller model may dispatch the device instructions with idle cycles in between at least some of the device instructions.

At block 708, the bus interface activity on the bus interface during the simulation is captured and recorded to generate a stimulus file. In some implementations, the bus interface activity captured in the stimulus file may include the device instructions and idle cycles provided on the bus interface by the controller model. In some implementations, the stimulus file may exclude some or all of the idle cycles, and/or may insert one or more idle cycles. The bus interface activity can be represented as the state of the data bus at each clock cycle, or as state transitions on the data bus.

Once the stimulus file has been generated, process 700 may proceed with the second phase of stress testing the integrated circuit design under test by replaying the simulation using a test bench driver. This second phase does not rely on the microcode of the controller model, and thus the microcode is bypassed. As such, the latency associated with the microcode can be reduced or eliminated to stress the integrated circuit design and speed up the simulation. The controller model can be held in reset during the second phase of replaying the simulation, or the controller model can be excluded from the simulation environment during the second phase.

The second phase of replaying the simulation may begin at block 710 by using the test bench driver to read the stimulus file. For example, the test bench driver can be implemented using system Verilog, and a system Verilog command can be used to read the stimulus file. At block 712, the test bench driver may remove some or all of the idle cycles from the bus interface activity captured in the stimulus file when replaying the simulation. The idle cycles can be removed at random, or according to a certain pattern. The test bench driver may also insert idle cycles. If the stimulus file already contains modified idle cycles, the test bench driver may replay the stimulus file as is, or further modify the idle cycles. Then at block 714, the test bench driver may inject the device instructions from the stimulus file with the modified idle cycles (e.g., without any removed idle cycles) into the integrated circuit design. When the integrated circuit design asserts the full signal described above, the test bench driver can maintain the current device instruction on the data bus until the full signal is deasserted to prevent an overflow condition at the integrated circuit design.

Figure 8:
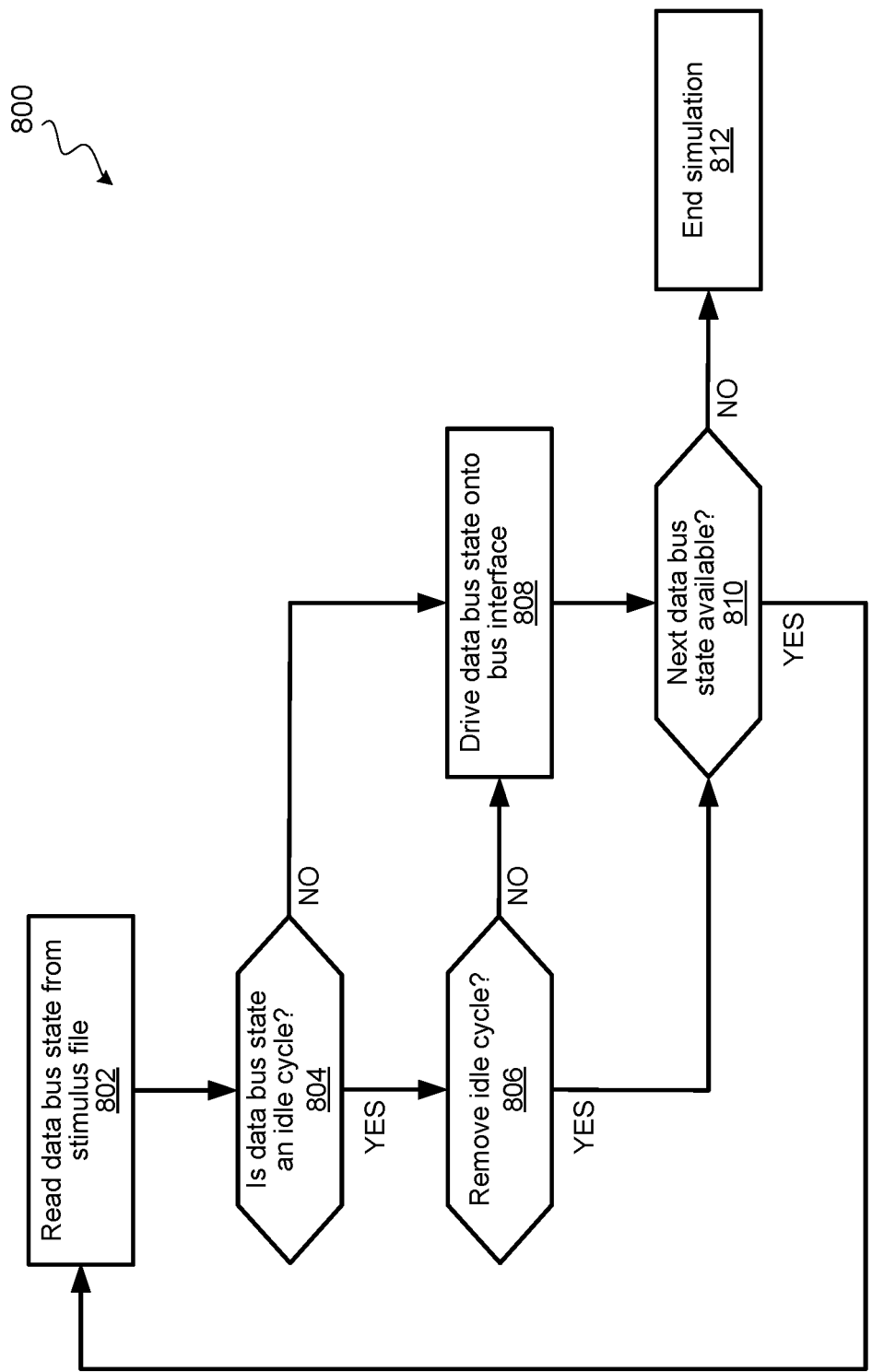
FIG. 8 illustrates a flow diagram of an example of a process for a test bench driver to replay a simulation.

FIG. 8 illustrates a flow diagram of an example of a process 800 that can be implemented by a test bench driver to replay a simulation. The test bench driver can be configured to read a binary stimulus file containing bus interface activity captured on a bus interface between a controller model and an integrated circuit design during a simulation. The test bench driver can be configured to remove one or more idle cycles from the bus interface activity, and inject the bus interface activity without the one or more idle cycles onto the bus interface while the controller model is being held in reset. In some implementations, the test bench driver can be implements in system Verilog.

Process 800 may begin at block 802 by reading a data bus state from the stimulus file. At block 804, a determination can be made as to whether the data bus state corresponds to an idle cycle (e.g., bus state is all zeros or high impedance, etc.). If the data bus state does not correspond to an idle cycle, then the data bus state can be driven onto the bus interface at block 808. If the data bus state corresponds to an idle cycle, then a determination can be made as to whether the idle cycle should be removed at block 806. If it is determined that the idle cycle should be removed, then process 800 may proceed to block 810 to determine if a next data bus state is available in the stimulus file. If it is determined that the idle cycle should not be removed, then process 800 may proceed to block 808 to drive the idle cycle onto the bus interface.

In some implementations, the idle cycle can be removed at random. In such implementations, a random number generator can be used to generate one of two numbers (e.g., 1 or 0), and the idle cycle can be removed if the generated number has a certain value (e.g., remove idle cycle when the generated number is 1). To increase the probability of an idle cycle being removed, the random number generator can be configured to generate a number within a number range (e.g., 1 to 100), and the idle cycle can be removed if the generated number meets a certain threshold value (e.g., remove idle cycle when the generated number is greater than 20).

In some implementations, the idle cycle can be removed if the idle cycle meets a certain pattern. For example, every other idle cycle can be removed, consecutive idle cycles can be reduced to one idle cycle, and/or idle cycles that are between certain values of the data bus state can be removed. In some implementations, all idle cycles can be removed, and block 806 may always proceed to block 810 in such instances.

At block 810, a determination is made as to whether any addition data bus state is available in the stimulus file. If the end of file has been reached, then process 800 may end the simulation at block 812. If the next data bus state is available, then process 800 may proceed back to block 802, and process 800 may continue.

Any of process 600, 700, and/or 800 can be embodied in a non-transitory computer readable medium. Other variations are also within the scope of the present disclosure. For example, to reduce the file size of the stimulus file, unwanted idle cycles can be removed as the stimulus file is being generated. For example, a test bench monitor may check if a data bus state corresponds to an idle cycle before recording the bus state in the stimulus file. If the data bus state corresponds to an idle cycle that is to be remove, the data bus state can be excluded from the stimulus file. In such implementations, the stimulus file can be replayed as is without further modification. In some implementations, the stimulus file can also be edited manually or with a script to remove unwanted idle cycles such that the stimulus file can be replayed as is during subsequent simulations.

Figure 9:
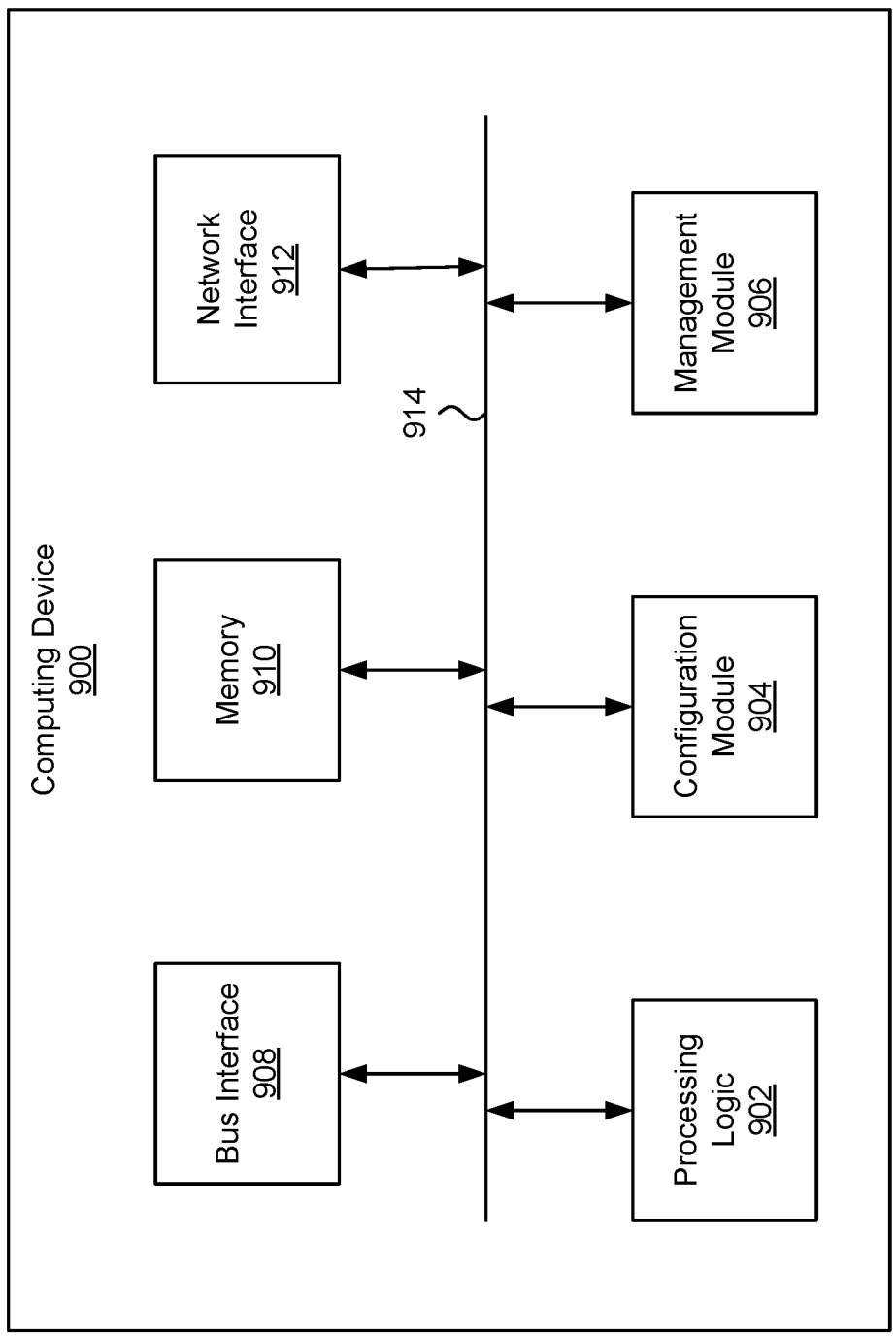
FIG. 9 illustrates an example of a computing device, according to certain aspects of the disclosure.

FIG. 9 illustrates an example of a computing device 900. Functionality and/or components of the computing device 900 may be used without limitation with other embodiments disclosed elsewhere in this disclosure, without limitations. Computing device 1000 can be used to perform, for example, processes 600, 700, and/or 800. In another context, the techniques for stress testing an integrated circuit design described herein can be applied to test one or more components of computing device 900 during the design cycle of such components.

In one example, the computing device 900 may include processing logic 902, a configuration module 904, a management module 906, a bus interface module 908, memory 910, and a network interface module 912. These modules may be hardware modules, software modules, or a combination of hardware and software. In certain instances, modules may be interchangeably used with components or engines, without deviating from the scope of the disclosure. The computing device 900 may include additional modules, not illustrated here. In some implementations, the computing device 900 may include fewer modules. In some implementations, one or more of the modules may be combined into one module. One or more of the modules may be in communication with each other over a communication channel 914. The communication channel 914 may include one or more busses, meshes, matrices, fabrics, a combination of these communication channels, or some other suitable communication channel.

The processing logic 902 may include application specific integrated circuits (ASICs), field programmable gate arrays (FPGAs), systems-on-chip (SoCs), network processing units (NPUs), processors configured to execute instructions or any other circuitry configured to perform logical arithmetic and floating-point operations. Examples of processors that may be included in the processing logic 902 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 902 may be stored on a computer-readable storage medium, for example, in the form of a computer program. The computer-readable storage medium may be non-transitory. In some cases, the computer-readable medium may be part of the memory 910.

The memory 910 may include either volatile or non-volatile, or both volatile and non-volatile types of memory. The memory 910 may, for example, include random access memory (RAM), read only memory (ROM), Electrically Erasable Programmable Read-Only Memory (EEPROM), flash memory, and/or some other suitable storage media. In some cases, some or all of the memory 910 may be internal to the computing device 900, while in other cases some or all of the memory may be external to the computing device 900. The memory 910 may store an operating system comprising executable instructions that, when executed by the processing logic 902, provides the execution environment for executing instructions providing networking functionality for the computing device 900. The memory may also store and maintain several data structures and routing tables for facilitating the functionality of the computing device 900.

In some implementations, the configuration module 904 may include one or more configuration registers. Configuration registers may control the operations of the computing device 900. In some implementations, one or more bits in the configuration register can represent certain capabilities of the computing device 900. Configuration registers may be programmed by instructions executing in the processing logic 902, and/or by an external entity, such as a host device, an operating system executing on a host device, and/or a remote device. The configuration module 904 may further include hardware and/or software that control the operations of the computing device 900.

In some implementations, the management module 906 may be configured to manage different components of the computing device 900. In some cases, the management module 906 may configure one or more bits in one or more configuration registers at power up, to enable or disable certain capabilities of the computing device 900. In certain implementations, the management module 906 may use processing resources from the processing logic 902. In other implementations, the management module 906 may have processing logic similar to the processing logic 902, but segmented away or implemented on a different power plane than the processing logic 902.

The bus interface module 908 may enable communication with external entities, such as a host device and/or other components in a computing system, over an external communication medium. The bus interface module 908 may include a physical interface for connecting to a cable, socket, port, or other connection to the external communication medium. The bus interface module 908 may further include hardware and/or software to manage incoming and outgoing transactions. The bus interface module 908 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 908 may include the physical layer for any of these bus protocols, including a connector, power management, and error handling, among other things. In some implementations, the computing device 900 may include multiple bus interface modules for communicating with multiple external entities. These multiple bus interface modules may implement the same local bus protocol, different local bus protocols, or a combination of the same and different bus protocols.

The network interface module 912 may include hardware and/or software for communicating with a network. This network interface module 912 may, for example, include physical connectors or physical ports for wired connection to a network, and/or antennas for wireless communication to a network. The network interface module 912 may further include hardware and/or software configured to implement a network protocol stack. The network interface module 912 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 900 may include multiple network interface modules, each configured to communicate with a different network. For example, in these implementations, the computing device 900 may include a network interface module for communicating with a wired Ethernet network, a wireless 802.11 network, a cellular network, an Infiniband network, etc.

The various components and modules of the computing device 900, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 9, FIG. $$$, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method for testing an integrated circuit design, the method comprising:
   running a simulation that includes:
      reading, by a controller model, controller instructions from a memory model;
      executing, by the controller model, microcode to translate the controller instructions into device instructions for an integrated circuit design under test; and
      dispatching, by the controller model, the device instructions onto a bus interface between the controller model and the integrated circuit design, wherein the device instructions are dispatched onto the bus interface with intervening idle cycles;
   capturing bus interface activity on the bus interface to generate a stimulus file, wherein one or more of the intervening idle cycles are excluded from the stimulus file; and
   executing a test bench driver to bypass the microcode and replay the simulation, wherein replaying the simulation includes:
      reading, by the test bench driver, the stimulus file; and
      injecting, by the test bench driver, the device instructions from the stimulus file into the integrated circuit design without the excluded one or more of the intervening idle cycles.

2. The computer-implemented method of claim 1, wherein the bus interface includes:
   a data bus;
   a push signal to indicate that a valid device instruction is present on the data bus; and
   a full signal generated by the integrated circuit design under test to indicate that a processing queue of the integrated circuit design is full.

3. The computer-implemented method of claim 2, wherein in response to the integrated circuit design asserting the full signal, the test bench driver maintains a current device instruction on the data bus until the full signal is deasserted.

4. The computer-implemented method of claim 1, wherein the controller model is held in reset while the test bench driver is injecting the device instructions.

5. A computer-implemented method, comprising:
   running a simulation that includes providing bus interface transactions and idle cycles on a bus interface of an integrated circuit design under test;
   capturing bus interface activity on the bus interface during the simulation to generate a stimulus file; and
   replaying the simulation by executing a test bench driver that reads the stimulus file and injects the bus interface transactions with modified idle cycles onto the bus interface of the integrated circuit design under test.

6. The computer-implemented method of claim 5, wherein the bus interface transactions include data movement instructions being dispatched to the integrated circuit design under test, the data movement instructions causing the integrated circuit design to fetch data from a memory model and load the data into a computational logic block of the integrated circuit design.

7. The computer-implemented method of claim 5, wherein the bus interface transactions are generated by a controller model executing microcode.

8. The computer-implemented method of claim 7, wherein the microcode executed by the controller model is a pre-release version that is undergoing optimization.

9. The computer-implemented method of claim 7, wherein the controller model is held in reset while the simulation is being replayed.

10. The computer-implemented method of claim 5, wherein the test bench driver is a system Verilog driver.

11. The computer-implemented method of claim 5, wherein the stimulus file is a binary file or a text file.

12. The computer-implemented method of claim 5, wherein the stimulus file includes data bus state information correlated with time information.

13. The computer-implemented method of claim 5, wherein the stimulus file is generated by excluding a plurality of the idle cycles from the bus interface activity.

14. The computer-implemented method of claim 5, wherein replaying the simulation includes removing a plurality of the idle cycles from the bus interface when the stimulus file is read.

15. The computer-implemented method of claim 5, wherein the bus interface transactions are injected onto the bus interface with all of the idle cycles removed.

16. The computer-implemented method of claim 5, wherein the bus interface includes a full signal indicating whether a processing queue of the integrated circuit design is full.

17. The computer-implemented method of claim 16, wherein in response to the full signal being asserted, the test bench driver maintains a current bus interface transaction on the bus interface until the full signal is deasserted.

18. The computer-implemented method of claim 17, wherein in response to the full signal being deasserted, the test bench driver injects a next bus interface transaction onto the bus interface.

19. The computer-implemented method of claim 5, wherein the integrated circuit design is a hardware accelerator design.

20. A non-transitory computer readable medium storing code that, when executed by one or more processors, causes the one or more processors to implement a test bench driver that is configured to:
   read a binary stimulus file containing bus interface activity captured in a prior simulation, the bus interface activity containing activity on a bus interface between a controller model and an integrated circuit design;
   modify one or more idle cycles from the bus interface activity; and
   inject the bus interface activity with the modified one or more idle cycles onto the bus interface while the controller model is being held in reset.

* * * * *